(12) United States Patent
Döllgast et al.

(10) Patent No.: US 7,948,150 B2
(45) Date of Patent: May 24, 2011

(54) PIEZOCERAMIC MULTILAYER ACTUATOR AND METHOD OF MANUFACTURING A PIEZOCERAMIC MULTILAYER ACTUATOR

(75) Inventors: Bernhard Döllgast, Deutschlandsberg (AT); Masahiro Inagaki, Kagoshima (JP); Harald Johannes Kastl, Fichtelberg (DE); Atsushi Ochi, Yokohama (JP); Takami Sakamoto, Kagoshima (JP); Carsten Schuh, Baldham (DE)

(73) Assignees: Siemens Aktiengesellschaft, Munich (DE); Kyocera Corporation, Kyoto (JP)

( * ) Notice: Subject to any disclaimer, the term of this patent is extended or adjusted under 35 U.S.C. 154(b) by 218 days.

(21) Appl. No.: 12/031,385

(22) Filed: Feb. 14, 2008

(65) Prior Publication Data

US 2008/0218028 A1    Sep. 11, 2008

(30) Foreign Application Priority Data

Feb. 19, 2007   (EP) ..................... 07003447

(51) Int. Cl.
*H01L 41/053*   (2006.01)
(52) U.S. Cl. ........................ 310/328; 310/348
(58) Field of Classification Search .................. 310/328, 310/348, 365, 366
See application file for complete search history.

(56) References Cited

U.S. PATENT DOCUMENTS

| | | | |
|---|---|---|---|
| 4,932,119 A * | 6/1990 | Ealey et al. ................. | 29/593 |
| 5,089,739 A * | 2/1992 | Takahashi et al. ............. | 310/328 |
| 5,406,164 A | 4/1995 | Okawa et al. ................. | 310/366 |
| 5,835,338 A | 11/1998 | Suzuki et al. ............... | 361/301.4 |
| 7,498,726 B2 | 3/2009 | Mochizuki et al. ........... | 310/364 |
| 7,518,295 B2 | 4/2009 | Mochizuki et al. ........... | 310/366 |
| 7,545,080 B2 | 6/2009 | Kastl et al. .................... | 310/328 |
| 7,598,660 B2 | 10/2009 | Kobayashi et al. ........... | 310/366 |
| 2003/0080651 A1 | 5/2003 | Murai et al. .................. | 310/328 |
| 2004/0178701 A1* | 9/2004 | Sato et al. ..................... | 310/328 |
| 2006/0043841 A1* | 3/2006 | Kadotani et al. .............. | 310/328 |
| 2006/0055288 A1 | 3/2006 | Heinzmann et al. .......... | 310/364 |
| 2006/0181178 A1 | 8/2006 | Kastl et al. .................... | 310/328 |
| 2006/0238073 A1 | 10/2006 | Ragossnig et al. ............ | 310/328 |
| 2009/0077782 A1 | 3/2009 | Takabe ......................... | 29/25.35 |

(Continued)

FOREIGN PATENT DOCUMENTS

DE    10307825    2/2003

(Continued)

OTHER PUBLICATIONS

European Search Report; EP 07 00 3447; pp. 3, Jul. 27, 2007.

(Continued)

*Primary Examiner* — Derek J Rosenau
(74) *Attorney, Agent, or Firm* — King & Spalding L.L.P.

(57) ABSTRACT

A piezoceramic multilayer actuator (10) includes a plurality of green layers, wherein the green layers are to be converted to piezoceramic layers (12) with a piezoceramic material in a subsequent step of heating. A security layer material mixture with a second material (32) and particles (30) embedded in the second material (32) is provided, wherein the particles (30) have a third material different from the first material and different from the second material (32). The security layer material mixture is laminated between two piezoceramic layers (12), thereby forming a green stack. The green stack is heated to a sintering temperature, wherein the green layers are converted to the piezoceramic layers (12), and wherein a chemical reaction of the third material degrades the mechanical connection of the piezoceramic layers (12) by the security layer (20).

10 Claims, 2 Drawing Sheets

U.S. PATENT DOCUMENTS

2009/0278422 A1   11/2009   Florian et al. ................. 310/326

FOREIGN PATENT DOCUMENTS

| DE | 102004031404 | 6/2004 |
|----|--------------|--------|
| WO | 03105246 | 12/2003 |
| WO | 2006000479 | 1/2006 |
| WO | 2006103154 | 3/2006 |
| WO | 2006042791 | 4/2006 |
| WO | 2006131106 | 12/2006 |

OTHER PUBLICATIONS

European Search Report for Application No. EP 07 00 3445 (3 pages), Jul. 11, 2007.
European Search Report for Application No. EP 07 00 3446 (3 pages), Jul. 13, 2007.

* cited by examiner

PIEZOCERAMIC MULTILAYER ACTUATOR AND METHOD OF MANUFACTURING A PIEZOCERAMIC MULTILAYER ACTUATOR

CROSS-REFERENCE TO RELATED APPLICATIONS

This application claims priority to European Patent Application Number 07003447 filed on Feb. 19, 2007, and which is incorporated herein by reference in its entirety.

TECHNICAL FIELD

The present invention refers to a piezoceramic multilayer actuator and a method of manufacturing a piezoceramic multilayer actuator.

BACKGROUND

Piezoceramic multilayer actuators convert electrical signals to mechanical operation. A voltage applied to electrodes of the piezoceramic multilayer actuator causes the actuator to change its length due to piezoelectric properties of a multitude of piezoceramic layers. The inner electrodes and the piezoceramic layers are alternatingly arranged in a stack. Every other inner electrode is electrically conductively connected to a first outer electrode, and every other inner electrode is electrically conductively connected to a second outer electrode. Each piezoceramic layer is arranged between one inner electrode connected to the first outer electrode and one inner electrode connected to the second outer electrode. Piezoceramic multilayer actuators like this are used to drive or control mechanics, fluids etc. Fuel injectors for combustion engines are an important application.

After manufacture, a large voltage is applied to the piezoceramic multilayer actuator. This large voltage polarizes the piezoceramic layers and causes a remnant deformation of the piezoceramic layers. In the vicinity of the outer electrodes, every other inner electrode does not completely extend to the edges of the adjacent piezoceramic layers but is isolated from the outer electrode. This causes inhomogeneous electrical fields within the piezoceramic layers and an inhomogeneous remnant distortion as well as inhomogeneous distortions during the normal operation of the actuator. Any inhomogeneous distortion as well as any imperfection of the piezoceramic multilayer actuator causes mechanical strain and stress within the actuator. In particular under highly dynamic operating conditions and at high temperatures, cracks at the interfaces between inner electrodes and piezoceramic layers, at the interfaces between the active stack and inactive top or bottom layers and within the piezoceramic layers result. Branching cracks or cracks growing in the stacking direction are particularly detrimental. As soon as a crack electrically insulates a part of an inner electrode, the inhomogenity is further increased and the growth of cracks is accelerated. Furthermore, chemically reactive fluids may intrude into the cracks and chemically destroy the piezoceramic layers and/or the inner electrodes.

SUMMARY

A more robust piezoceramic multilayer actuator and method of manufacturing a piezoceramic multilayer actuator can be achieved According to an embodiment by a method of manufacturing a piezoceramic multilayer actuator, the method comprising the steps of:—providing a plurality of green layers, wherein the green layers are to be converted to piezoceramic layers comprising a piezoceramic material in a subsequent step of heating;—providing a security layer material mixture comprising a second material and particles embedded in the second material, wherein the particles comprise a third material different from the first material and different from the second material;—laminating the security layer material mixture between two piezoceramic layers, thereby forming a green stack;—heating the green stack to a sintering temperature, wherein the green layers are converted to the piezoceramic layers, and wherein a chemical reaction or a phase change or an alteration of the third material degrades the mechanical connection of the piezoceramic layers by the security layer.

According to a further embodiment, in the step of heating, the third material chemically reacts with the first material or with the second material in the vicinity of the particles and mechanically degrades the first or second material, respectively, by increasing the brittleness or reducing the ductility or the cohesion of the first or second material, respectively. According to a further embodiment, the chemical reaction increases the brittleness of the third material or decreases the cohesion of the third material. According to a further embodiment, in the step of heating, the third material shrinks and/or the second material grows. According to a further embodiment, the shrinkage of the particles and/or the growth of the second material causes gaps to evolve between the particles and the piezoceramic layers. According to a further embodiment, in the step of heating, the third material grows and/or the second material shrinks. According to a further embodiment, the growth of the particles or the shrinkage of the second material causes gaps to evolve between the second material and the piezoceramic layers. According to a further embodiment, the chemical reaction of the third material is a chemical reaction of the third material and the first material at an interface between one of the particles and one of the plurality of piezoceramic layer, and wherein the chemical reaction locally increases the brittleness of the first material or reduces the adhesion between the piezoceramic layer and the security layer or locally alters the densification behavior and/or the sintering behavior of the first material. According to a further embodiment, the chemical reaction of the third material is a chemical reaction of the third material and the second material at an interface between one of the particles and the second material, and wherein the chemical reaction locally increases the brittleness of the second material or reduces the adhesion between the piezoceramic layer and the security layer or locally reduces the cohesion of the second material or locally alters the densification behavior and/or the sintering behavior of the second material. According to a further embodiment, the first material comprises Pb, and wherein, in the step of heating, Pb diffuses from the first material to the third material, thereby locally reducing the cohesion of the first material or the adhesion of the first material to the security layer.

According to another embodiment, a piezoceramic multilayer actuator may comprise a plurality of piezoceramic layers comprising a piezoceramic first material sintered at a sintering temperature; and a security layer disposed between two piezoceramic layers; wherein the security layer comprises a second material and particles at least partially embedded in the second material, wherein the particles comprise a third material different from the first material and different from the second material, and wherein the third material is more brittle than the first material and the second material or gaps at an interface between the security layer and a piezoceramic layer degrade the mechanical connection of the security layer and the piezoceramic layer or the first material or the second material are locally mechanically degraded at interfaces between the first material or the second material, respectively, and the particles.

According to a further embodiment, the third material may comprise at least one of $TiO_2$, $ZrTiO_2$, $Ce_2O_3$ and $La_2O_3$.

BRIEF DESCRIPTION OF THE DRAWINGS

Some embodiments will now be described with reference to the Figures enclosed herewith. In the Figures.

DETAILED DESCRIPTION

Figure 1:
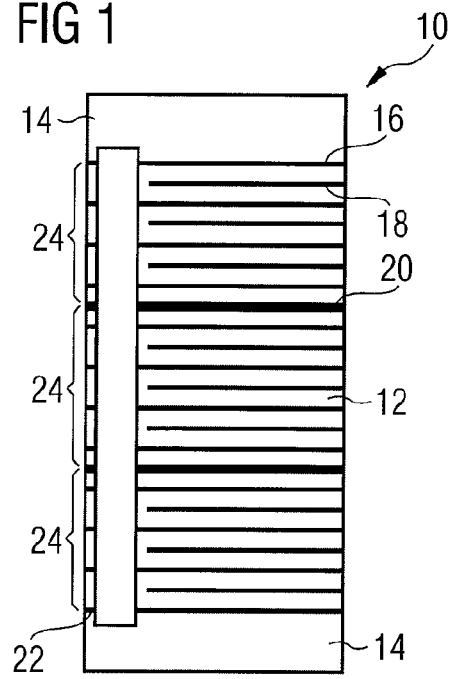
FIG. 1 is a schematic representation of a piezoceramic multilayer actuator.

The various embodiments are based on the idea to weaken, or degrade, or impair the mechanical connection between a piezoceramic layer and an adjacent security layer or between two neighbouring piezoceramic layers across a security layer by means of particles introduced into a matrix material of the security layer. The particles do not form ceramic bridges between piezoceramic layers wherein the ceramic bridges strengthen or sustain the cohesion of the piezoceramic layers and the entire stack. Rather, the particles are chemically inert and do not chemically react with the piezoceramic material or with the matrix material of the security layer and, after firing, there is a low adhesion between the particles and the piezoceramic material or between the particles and the matrix material of the security layer. As an alternative, the particles do react with the piezoceramic material and/or with the matrix material of the security layer but, after firing, the adhesion between the particles and the piezoceramic material is low or the adhesion between the particles and the matrix material of the security layer is low.

Throughout this application, a low adhesion means no adhesion or essentially no adhesion or an adhesion which is weaker than the adhesion between the piezoceramic layers and the matrix material of the security layer.

The low adhesion between the particles and the piezoceramic material and/or between the particles and the matrix material of the security layer weakens the mechanical linkage between a piezoceramic layer and the adjacent security layer or the mechanical linkage between two piezoceramic layers via a security layer. In both cases, the more particles are comprised in a security layer or the higher the volume fraction of the particles in the security layer is, the weaker is the mechanical linkage between the security layer and the adjacent piezoceramic layers or between the adjacent piezoceramic layers. Therefore, a volume share of at least 5%, at least 10%, at least 20% or at least 40% is advantageous. In particular in case of a low adhesion between the particles and the piezoceramic material, the size of each particle preferably essentially may equal or may be slightly larger than the thickness of the security layer.

Alternatively or additionally to the above described low adhesion, the material of the particles is more brittle than the piezoceramic material and more brittle than the matrix material of the security layer. This brittleness of the particles may be an original property of the particles or may result from a conversion of the material of the particles during firing due to a chemical reaction and/or due to diffusion of components from the piezoceramic material or from the matrix material of the security layer to the particles or vice versa. Throughout this description, a chemical reaction includes any kind of chemical reaction or chemical conversion from one chemical configuration to another chemical configuration and any kind of integration of diffused or originally present components, or atoms, into lattice sites or interstitial sites of a crystal lattice or a polycrystalline or amorphous phase. Furthermore, any alteration of the crystal structure shall be included, for example driving water of crystallisation out of the crystal.

Alternatively or additionally to the above described low adhesion and/or high brittleness of the particles, the particles locally increase the brittleness and/or reduce the cohesion of the piezoceramic material and/or of the matrix material of the security layer in the vicinity of the particles. This increase of brittleness and/or reduction of cohesion of the piezoceramic material can appear during firing due to a chemical reaction and/or diffusion of components from the piezoceramic material or from the matrix material to the particles or vice versa. For example water of crystallisation can diffuse from the particles to the piezoceramic material to the matrix material or to the piezoceramic material or vice versa thereby altering the crystal structure. This shrinkage is for example due to a phase change or an alteration of the crystal structure during the process of firing which is not reversed during cooling down after the process of firing.

Preferably, the densification and/or sintering behaviour of the matrix material of the security layer or of a thin layer of the piezoceramic material at the interface between the piezoceramic layer and the security layer may be modified or altered by a diffusion of components or elements and/or a chemical reaction. In this way, the adhesion between the security layer and the piezoceramic layers can be reduced.

In the particular case of a PZT piezoceramic material, the creation of a PbPdO-phase at the interfaces between the security layer and the piezoceramic layers can be influenced. The PZT can separate or unmix into $PbTiO_3$ and $ZrO_2$ and $TiO_2$ thereby destroying the microstructure and considerably reducing the cohesion of the PZT.

Alternatively or additionally to one or more of the above described mechanisms, a growth of the particles during firing and/or different thermal expansion coefficients of the particles and the matrix material of the security layer cause the production and growth of tension forces or microcracks during firing and/or when the stack is cooled down.

The above described mechanisms and measures weaken the mechanical connection or linkage between a piezoceramic layer and an adjacent security layer or between two piezoceramic layers via a security layer. In this way, a security layer or an interface between the security layer and an adjacent piezoceramic layer form a predetermined breaking point. Mechanical strain causes the formation and growth of a crack within the security layer or along the interface between the security layer and the piezoceramic layer.

Preferably a piezoceramic multilayer actuator may comprise sub-stacks, each sub-stack comprising a predetermined number of piezoceramic layers and a corresponding number of inner electrodes. The security layers according to various embodiments are arranged between the sub-stacks. Mechanical strain induces cracks within the security electrodes but most probably not within the sub-stacks. Therefore, the operation and action of the sub-stacks is guaranteed and the reliability of the whole piezoceramic multilayer actuator is increased.

As an alternative, all the inner electrodes can be provided as security layers, in particular when the particles do not weaken the cohesion of the security layer but the adhesion of the security layer to the piezoceramic layers. In this case, the matrix material of the security layer is electrically conductive.

A further advantage is that the particles can be easily introduced into the security layer. $TiO_2$, $ZrTiO_2$, $Ce_2O_3$ and $La_2O_3$ and other inorganic materials are examples for appropriate materials of the particles.

FIG. 1 is a schematic representation of a piezoceramic multilayer actuator 10 comprising a plurality of piezoceramic layers 12, a plurality of first inner electrodes 16 and a plurality of second inner electrodes 18. The piezoceramic layers 12 comprise a piezoceramic first material sintered at a sintering temperature and providing a piezoelectric effect. The first inner electrodes 16 are electrically conductively connected to a first outer electrode 22, and the second inner electrodes 18 are electrically conductively connected to a second outer electrode not displayed in FIG. 1. The first inner electrodes 16 are electrically insulated from the second outer electrode, and the second inner electrodes 18 are electrically insulated from the first outer electrode 22. Groups of piezoceramic layers 12 and inner electrodes 16, 18 form sub-stacks 24. Security layers 20 are arranged between the sub-stacks 24. Top and bottom of the piezoceramic multilayer actuator 10 are covered by top and bottom layers 14.

A number of alternative embodiments of the security layers 20 are described subsequently with respect to the FIGS. 2 to 6. Each of the FIGS. 2 to 6 displays a schematic representation of a section of a part of a piezoceramic multilayer actuator, wherein the section is perpendicular to the piezoceramic layers 12, to the inner electrodes 16, 18 and to the security layer 20. Although each of the FIGS. 2 to 6 displays merely one security layer and two adjacent piezoceramic layers, each of the piezoceramic multilayer actuators can comprise any number of piezoceramic layers, any number of inner electrodes and any number of security layers. In each of the embodiments, the security layer can be electrically insulating or electrically conductive. In the latter case, the security layer can serve as inner electrode or all inner electrodes of the piezoceramic multilayer actuator can be security layers.

Figure 2:
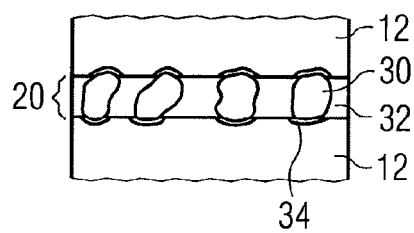
FIG. 2 is a schematic representation of a part of the piezoceramic multilayer actuator.

Referring to FIG. 2, the security layer 20 comprises a matrix material 32 and particles 30 at least partially embedded in the matrix material 32. The diameter of each particle 30 essentially equals or is slightly bigger than the thickness of the security layer 20. There is a thin gap 34 between each particle 30 and each adjacent piezoceramic layer 12.

During manufacture of the piezoceramic multilayer actuator described with reference to FIG. 2, a mixture of the matrix material 32 and the particles 30 is laminated between green sheets. A green stack comprising a plurality of green sheets, a plurality of electrode layers and the mixture of the matrix material 32 and the particles 30 sandwiched between green sheets is then heated to an elevated temperature for a predetermined period of time. During this debinding and sintering process, or baking process, or firing process, the green sheets are converted to the piezoceramic layers 12, the electrode layers are converted to the inner electrodes 16, 18 and the mixture of the matrix material 32 and the particles 30 is converted to the security layer 20.

During or after the process of firing, the thin gaps 34 may be produced in several alternative ways. According to a first embodiment, the particles 30 are shrinking during the process of firing while the matrix material 32 is not shrinking or is growing, or a shrinkage of the particles 30 is stronger than a shrinkage of the matrix material 32, or the matrix material 32 is growing more than the particles 30. Any shrinkage of the particles 30 or the matrix material 32 may be due to a densification or sintering of the respective material and/or to a diffusion of components from the respective material to the vicinity. For example, the diffusion of chemical components of the particles 30 from the particles 30 to the adjacent green layer or to the matrix material 32 may cause a shrinkage of the particles 30 and/or a growth of the matrix material 32 or the green layer. This shrinkage is for example due to a phase change or an alteration of the crystal structure during the process of firing which is not reversed during cooling down after the process of firing.

As an alternative, the thin gaps 34 are produced during cooling down the stack after the process of firing. When cooling down, any material with a positive thermal expansion coefficient shrinks. When the thermal expansion coefficient of the particles 30 is bigger than the thermal expansion coefficient of the matrix material 32, the particles 30 shrink more than the matrix material 32 and the gaps 34 can emerge.

Irrespective of whether the gaps 34 emerge during or after firing, no adhesion or a low adhesion between the particles 30 and the green sheets and the piezoceramic layers 12 facilitates the formation of the gaps 34 at the interfaces between the particles 30 and the piezoceramic layers 12.

Figure 3:
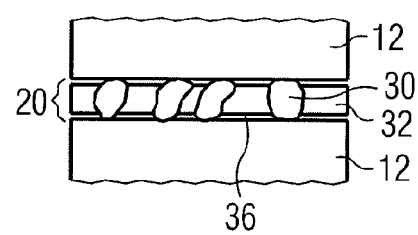
FIG. 3 is a schematic representation of a part of a piezoceramic multilayer actuator.

FIG. 3 shows a schematic view of a section of a part of another piezoceramic multilayer actuator. A security layer 20 between two piezoceramic layers 12 comprises a matrix material 32 and particles 30 at least partially embedded in the matrix material 32. The diameters of the particles 30 essentially equal the thickness of the security layer 20. Thus, many or all particles 30 are in contact with both adjacent piezoceramic layers 12. Gaps 36 are arranged between the matrix material 32 and the piezoceramic layers 12.

The security layer 20 is produced by laminating a mixture of the matrix material 32 and the particles 30 between green sheets. In a firing process similar to the firing process described above with reference to FIG. 2, the green sheets are converted to the piezoceramic layers 12. The gaps 36 emerge during the process of firing when the matrix material 32 is shrinking more than the particles 30, or when the particles 30 are growing more than the matrix material 32, or when the particles 30 are growing while the matrix material 32 is shrinking. Alternatively or additionally, the gaps 36 emerge or grow after the process of firing when the thermal expansion coefficient of the matrix material 32 exceeds the thermal expansion coefficient of the particles 30. Irrespective of whether the gaps primarily emerge during or after the process of firing, the formation of the gaps 36 is facilitated by a low adhesion or no adhesion between the matrix material 32 and the green sheets and the piezoceramic layers 12.

Figure 4:
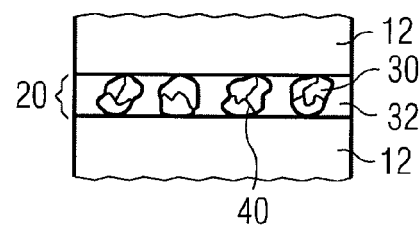
FIG. 4 is a schematic representation of a part of a piezoceramic multilayer actuator.

FIG. 4 displays a schematic view of a part of a section through another piezoceramic multilayer actuator. A security layer 20 between piezoceramic layers 12 comprises a matrix material 32 and particles 30 at least partially embedded in the matrix material 32. The particles 30 comprise a glass or any other brittle material which is more brittle and/or less ductile than the matrix material 32 and the material of piezoceramic layers 12. Therefore, mechanical stress or strain within the piezoceramic multilayer actuator during or after the process of firing or during normal operation of the actuator causes cracks 40 to emerge in the particles 30. The formation of the cracks 40 can be facilitated by a low cohesion within the particles 30.

Each of the high brittleness and the low cohesion may be an original property of the particles 30 or result from a conversion of the material of the particles 30 during a firing process.

In the piezoceramic multilayer actuators described with reference to FIGS. 2 to 4, the size and shape of the gaps 34, 36 and the cracks 40, respectively, may deviate from those displayed in the FIGS. 2 to 4. In particular, the gaps 34 of the piezoceramic multilayer actuator described above with reference to FIG. 2 can be more or less shifted with reference to the interface between the particles 30 and the piezoceramic layer 12. For example when the adhesion between the piezoceramic layer 12 and the particles 30 is stronger than the cohesion within the particles 30, the gaps 34 can at least partially be (slightly) shifted away from the piezoceramic layer 12 and into the particles 30. For example when the adhesion between the particles 30 and the piezoceramic layers 12 is stronger than the cohesion within the piezoceramic layers 12, the gaps 34 can at least partially be (slightly) shifted away from the particles 30 and into the piezoceramic layers 12. Furthermore, the gaps 34 can at least partially extend along the interfaces between the particles 30 and the matrix material 32 or along the interfaces between the matrix material 32 and the piezoceramic layers 12. In any case, a gap 34 not necessarily forms at each and every interface between a particle 30 and a piezoceramic layer 12.

In the piezoceramic multilayer actuator described above with reference to FIG. 3, the gaps 36 may be shifted away from the interfaces between the matrix material 32 and the piezoceramic layers 12. For example when the cohesion within the piezoceramic layers 12 is weaker than the adhesion between the matrix material 32 and the piezoceramic layers 12, the gaps 36 can at least partially be (slightly) shifted into the piezoceramic layers 12. For example when the adhesion between the matrix material 32 and the piezoceramic layers 12 is stronger than the cohesion within the matrix material 32, the gaps 36 can at least partially be (slightly) shifted into the matrix material 32. Furthermore, the gaps 36 can at least partially extend along the interfaces between the particles 30 and the matrix material 32 or along the interfaces between the particles 30 and the piezoceramic layers 12.

In the piezoceramic multilayer actuator described above with reference to FIG. 4, the cracks 40 can extend beyond the interfaces between the particles 30 and the matrix material 32 into the matrix material 32. Preferably, the cracks 40 do not extend beyond the interfaces between the particles 30 and the piezoceramic layers 12 into the piezoceramic layers 12.

In the piezoceramic multilayer actuators described above with reference to the FIGS. 2 to 4, the effective total interface area between the security layer and an adjacent piezoceramic layer is reduced, thereby reducing the total effective cohesion between the security layer and the adjacent piezoceramic layer.

Figure 5:
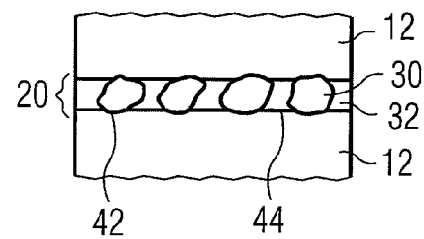
FIG. 5 is a schematic representation of a part of a piezoceramic multilayer actuator.

FIG. 5 displays a schematic view of a part of a section through another piezoceramic multilayer actuator. A security layer 20 between piezoceramic layers 12 comprises a matrix material 32 and particles 30 at least partially embedded in the matrix material 32. According to a first variant, the materials of the particles 30 and the piezoceramic layers 12 provide a low adhesion or no adhesion between the particles 30 and the piezoceramic layers 12 at interfaces 42 between the particles 30 and the piezoceramic layers 12. This low adhesion may be originally present in a green stack comprising green layers which are converted to the security layer 20 and to the piezoceramic layers 12 in a subsequent firing process. As an alternative, the low adhesion may emerge during the process of firing due to diffusion of components between the particles 30, the matrix material 32 and the piezoceramic layers 12 and/or due to chemical alterations of the particles 30 and/or the piezoceramic layers 12 in the adjacencies of the interfaces 42 between the particles 30 and the piezoceramic layers 12. As a further alternative, the low adhesion may emerge during the process of firing due to a phase change or an alteration of the crystal structure of the particles 30.

According to another variant, the particles 30 locally alter the piezoceramic layer 12 material near the interfaces 42 between the particles 30 and the piezoceramic layers 12 and/or near the interfaces between the matrix material 32 and the piezoceramic layers 12. This alteration may be due to the diffusion of components from the piezoceramic layers 12 to the particles 30 or vice versa and/or due to chemical reactions at or near the interfaces 42 between the particles 30 and the piezoceramic layers 12 and the interfaces 44 between the matrix material 32 and the piezoceramic layers 12. For example, when the piezoceramic layers 12 comprise PZT (Lead Zirconate Titanate, $Pb(Zr_xTi_{1-x})O_3$) and the particles 30 are able to absorb lead (Pb), the PZT can be locally unmixed or separated into $PbTiO_3$, $ZrO_2$ and $TiO_2$ at or near the interfaces between the particles and the piezoceramic layers. Thereby the microstructure of the piezoceramic layers 12 is locally destroyed, the brittleness can be increased and the ductility can be reduced.

As a further variant, the particles 30 influence the creation of PbPdO-phases at the interfaces 42 between the particles 30 and the piezoceramic layers 12 and/or between the matrix material 32 and the piezoceramic layers 12 thereby reducing the adhesion between the piezoceramic layers 12 and the security layer 20.

As a further variant, the densification behaviour of the piezoceramic layers 12 or their green predecessors can be locally altered, in an extreme example resulting in an open pore network at the interfaces between the piezoceramic layers 12 and the security layer 20. Ag vapour and/or PbO vapour can infiltrate these open pores.

In all the piezoceramic multilayer actuators described above with reference to FIGS. 2 to 5, the gaps 34, 36, the cracks 40, the low adhesion at interfaces 42, 44, the locally destroyed microstructure or the open pore network weaken the mechanical connection, or linkage, between the piezoceramic layers 12 and the security layers 20. In this way, the security layer 20 forms a predetermined breaking point similar to a perforation of a writing pad and localizes or restricts the generation or growth of any cracks to the security layer 20. Any mechanical strain or stress within the piezoceramic multilayer actuator most probably causes a crack to emerge and grow along the security layer 20. Thereby, the risk that a crack destroys a piezoceramic layer 12 or an inner electrode 16, 18 is largely reduced.

In the piezoceramic multilayer actuators described above with reference to FIGS. 2 to 5, the diameters of the particles 30 have been described to essentially equal the thickness of the security layers 20. This is advantageous for several aspects and particularly for the formation of gaps 34, 36 as described above with reference to FIGS. 2 and 3.

Figure 6:
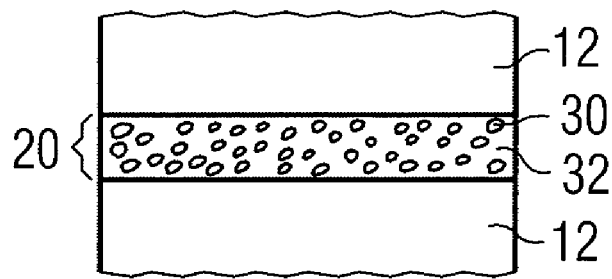
FIG. 6 is a schematic representation of a part of a piezoceramic multilayer actuator.

However, particles 30 smaller or much smaller than the thickness of the security layer 20 can be advantageous, too. FIG. 6 displays a schematic view of a part of a section through a piezoceramic multilayer actuator with a security layer 20 between piezoceramic layers 12. The security layer 20 comprises a matrix material 32 and particles 30 at least partially embedded in the matrix material 32. The diameters of the particles 30 are smaller or much smaller than the thickness of the security layer 20. A high brittleness of the particles 30, a low adhesion between the particles 30 and the matrix material 32 or any influence of the particles on the creation of a PbPdO-phases or on the densification behaviour of the piezoceramic layers 12 in the vicinity of the security layer 20 provides a predetermined breaking point similar to the piezoceramic multilayer actuators described above with reference to FIGS. 2 to 5. In particular, the security layer is weakened by a diffusion between the particles 30 and the matrix material 32, a chemical reaction of diffused material and/or a phase change or a change of the crystal structure of the particles 30 causing a high brittleness of the particles 30 and/or a low adhesion of the particles 30 to the matrix material 32.

Figure 7:
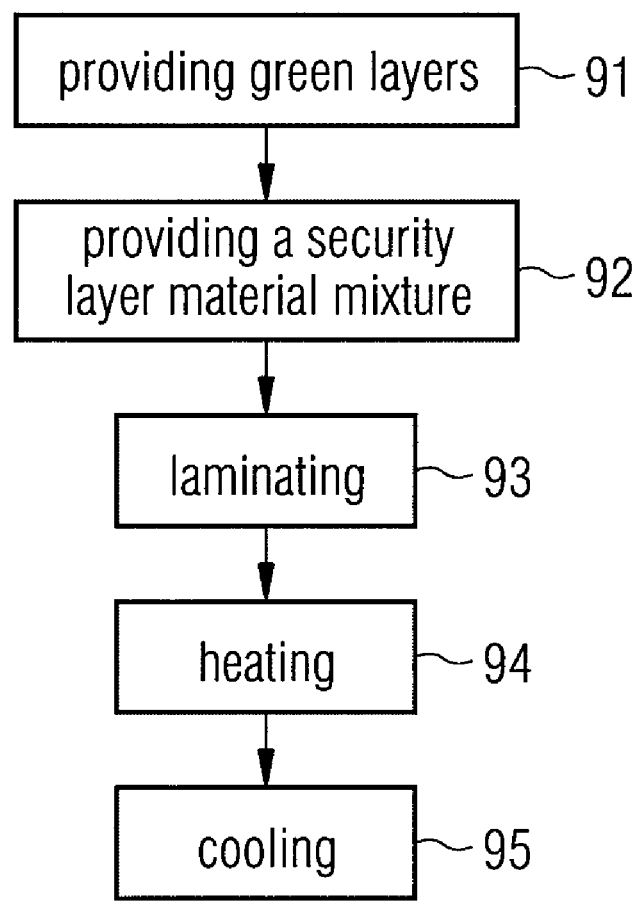
FIG. 7 is a schematic flow chart of the method of manufacturing a piezoceramic multilayer actuator.

FIG. 7 shows a schematic flow chart of a method of manufacturing a piezoceramic multilayer actuator. In a first step 91, a plurality of green sheets or green layers are provided which will be converted to piezoceramic layers in the course of the method. In a second step 92, a security layer material mixture comprising a second material as a matrix material and particles embedded in the second material is provided. The particles comprise a third material different from the first material and the second material. In a third step 93, the security layer is laminated between two green layers thereby forming a green stack. In a fourth step 94, the green stack is heated first to a debinding temperature and then to a sintering temperature for a predetermined period of time. During this firing, or baking, or sintering step, the green layers are converted to the piezoceramic layers comprising the piezoceramic first material. In a fifth step 95, the piezoceramic multilayer actuator is cooled down to room temperature or to an even lower temperature.

When the above described method is applied to manufacture a piezoceramic multilayer actuator as described above with reference to FIG. 2, the third material is shrinking more than the second material or the second material is growing more than the third material during the fourth step and/or during the fifth step. In order to manufacture a piezoceramic multilayer actuator as described above with reference to FIG. 3, the third material is growing more than the second material or the second material is shrinking more than the third material during the fourth step and/or during the fifth step. In order to manufacture a piezoceramic multilayer actuator as described above with reference to FIG. 4, the third material may be preferably chemically altered or converted during the fourth step, thereby increasing its brittleness. In order to manufacture the piezoceramic multilayer actuator as described above with reference to FIG. 5, the diffusion of components (for example lead Pb) from the green layers to the particles or vice versa, or from the matrix material to the particles or vice versa, or from the green layer to the matrix material or vice versa and/or a chemical reaction locally alters the densification behaviour and/or the sintering behaviour of the first material and/or the adhesion between the first material and the second or third material and/or locally increases the brittleness of the first material in the vicinity of the security layer. For all the piezoceramic multilayer actuators described above with reference to the FIGS. 2 to 6, the described mechanisms weakening the security layer can be alternatively consist of or can be assisted by a phase change or an alteration of the crystal structure of the particles 30 during the process of firing.

In the piezoceramic multilayer actuators described above with reference to the FIGS. 2 to 6, the matrix material 32 can be electrically conductive or electrically insulating. When the matrix material is electrically conductive, the security layer can serve as an inner electrode.

Although it is preferred that the piezoceramic multilayer actuator comprises a number of sub-stacks mechanically connected to each other via security layers, each sub-stack comprising a number of inner electrodes, all inner electrodes of the piezoceramic multilayer actuator can be security layers as described above with reference to FIGS. 2 to 6.

Although the particles preferably comprise $TiO_2$, $ZrTiO_2$, $Ce_2O_3$ or $La_2O_3$ or any other electrically insulating or matrix material, other materials can be advantageous for certain applications, too.

What is claimed is:

1. A piezoceramic multilayer actuator comprising:
   a plurality of piezoceramic layers comprising a piezoceramic first material sintered at a sintering temperature; and
   a security layer disposed between two piezoceramic layers such that the two piezoceramic layers on opposing sides of the security layer are substantially fully separated from each other by the security layer; and
   wherein the security layer comprises a second material and particles at least partially embedded in the second material,
   wherein the particles comprise a third material different from the first material and different from the second material, and
   wherein a weakened connection between the security layer and at least one adjacent piezoceramic layer is created due to at least one of the following:
   (a) the third material is more brittle than the first material and the second material,
   (b) gaps are formed at an interface between the security layer and a piezoceramic layer that degrade the mechanical connection of the security layer and the piezoceramic layer, and
   (c) the first material or the second material are locally mechanically degraded at interfaces between the first material or the second material, respectively, and the particles.

2. The piezoceramic multilayer actuator according to claim 1, wherein the third material comprises at least one of $TiO_2$, $ZrTiO_2$, $Ce_2O_3$ and $La_2O_3$.

3. A piezoceramic multilayer actuator, comprising:
   a plurality of green layers converted to piezoceramic layers comprising a piezoceramic material; and
   a security layer material mixture comprising a second material and particles embedded in the second material,
   wherein the particles comprise a third material different from the first material and different from the second material,
   wherein the security layer material mixture is laminated between two piezoceramic layers, thereby forming a green stack such that the two piezoceramic layers are substantially fully separated from each other by the security layer, and
   a degraded mechanical connection is provided between the security layer material mixture and the piezoceramic layers directly adjacent the security layer material mixture, the degraded mechanical connection being formed during production of the piezoceramic multilayer actuator by at least one of (a) a chemical reaction, (b) a phase change, and (c) an alteration of the third material.

4. The actuator according to claim 3, wherein, during production of the piezoceramic multilayer actuator, the third material chemically reacts with the first material or with the second material in the vicinity of the particles and mechanically degrades the first or second material, respectively, by increasing the brittleness or reducing the ductility or the cohesion of the first or second material, respectively.

5. The actuator according to claim 3, wherein, during production of the piezoceramic multilayer actuator, the chemical reaction increases the brittleness of the third material or decreases the cohesion of the third material.

6. The actuator according to claim 3, wherein the third material shrinks and/or the second material grows.

7. The actuator according to claim 6, comprising gaps between the particles and the piezoceramic layers.

8. The actuator according to claim 3, wherein, during production of the piezoceramic multilayer actuator, the third material grows and/or the second material shrinks.

9. The actuator according to claim 8, comprising gaps to evolve between the second material and the piezoceramic layers during production of the piezoceramic multilayer actuator.

10. The actuator according to claim 3, wherein the first material comprises Pb which diffuses from the first material to the third material during production of the piezoceramic multilayer actuator, thereby locally reducing the cohesion of the first material or the adhesion of the first material to the security layer.

* * * * *